United States Patent [19]

Brokaw

[11] Patent Number: 5,227,670
[45] Date of Patent: Jul. 13, 1993

[54] ELECTRONIC SWITCH WITH VERY LOW DYNAMIC "ON" RESISTANCE UTILIZING AN OP-AMP

[75] Inventor: A. Paul Brokaw, Burlington, Mass.
[73] Assignee: Analog Devices, Inc., Norwood, Mass.
[21] Appl. No.: 785,530
[22] Filed: Oct. 31, 1991
[51] Int. Cl.[5] .......................................... H03K 17/60
[52] U.S. Cl. .................................... 307/254; 307/494; 307/520
[58] Field of Search ............. 307/490, 494, 498, 353, 307/254, 496, 520; 330/252

[56] References Cited

U.S. PATENT DOCUMENTS

| | | | |
|---|---|---|---|
| 3,614,645 | 10/1971 | Wheatley | 330/255 |
| 3,671,782 | 6/1972 | Wittlinger et al. | 307/494 |
| 4,185,211 | 1/1980 | Kucharewski | 307/359 |
| 4,951,003 | 8/1990 | De Jager et al. | 330/252 |
| 4,954,769 | 9/1990 | Kalthoff | 307/296.6 |

Primary Examiner—William L. Sikes
Assistant Examiner—Toan Tran
Attorney, Agent, or Firm—Iandiorio & Dingman

[57] ABSTRACT

An electronic switch with very low dynamic "on" resistance includes an operational transconductance amplifier including a non-inverting input adapted for connection to a reference potential and an inverting input interconnected with the amplifier output; and control means for enabling the amplifier output to provide a low-impedance virtual potential at the inverting input approximately the same as that of the reference potential and for disabling the amplifier output to promote a high impedance at the inverting input.

3 Claims, 3 Drawing Sheets

ELECTRONIC SWITCH WITH VERY LOW DYNAMIC "ON" RESISTANCE UTILIZING AN OP-AMP

FIELD OF INVENTION

This invention relates to an electronic switch with very low dynamic "on" resistance, and more particularly to such a switch which uses an operational transconductance amplifier to provide low resistance when it is enabled.

BACKGROUND OF INVENTION

Electronic switches with high "off" impedance and virtually zero "on" impedance are desirable in many applications. For example, in knock sensor signal conditioner systems for internal combustion engines such an electronic switch with low dynamic "on" resistance is desirable to switch resistors used to select the center frequency of the knock signal being sensed.

Presently, MOSFET switches, or inverted mode bipolar chopper transistors, are often used as low resistance electronic switches, but the currently available devices, in order to provide a very low (less than an ohm) dynamic impedance, are of such a large size that they are impractical for many applications. As the available parameters concerning size constraints, parts, devices and material selection narrow in a given design, the use of MOSFET type switches becomes increasingly outmoded. That is the case with such switches needed for switching the bandpass selection resistors in knock sensor signal conditioner systems which form a part of knock sensor units in the electronic control circuits used with internal combustion engines. Electronic control circuits are used with internal combustion engines in order to optimize their operation under a variety of conditions. One component of such control circuits is "knock" sensor units which sense "knocking" or pre-ignition during engine operation and adjust various parameters such as timing and fuel mixture in order to minimize knocking. Knocking can be caused by a variety of factors including timing, fuel mixture, compression ratio, manifold pressure, exhaust back pressure, and fuel octane rating. Knocking is undesirable because it increases wear and decreases efficiency. A knock sensor unit uses one or more sensors to sense the vibrations caused by the knocking. The detecting of knocking is used to generate a signal which is used by the controller circuit to adjust various engine parameters and reduce or eliminate the knocking.

SUMMARY OF INVENTION

It is therefore an object of this invention to provide an improved electronic switch with very low "on" resistance.

It is a further object of this invention to provide such an electronic switch with very low dynamic "on" resistance which uses an operational transconductance amplifier to provide low resistance when it is enabled.

It is a further object of this invention to provide such an improved electronic switch with very low "on" resistance which requires less surface area than traditional MOSFET switches or inverted mode bipolar chopper transistors.

The invention results from the realization that a truly simple and effective low resistance electronic switch can be achieved by connecting the inverting input to the output of an operational transconductance amplifier which results in a high impedance in the "off" state and a very low impedance when the amplifier is "on".

This invention features an electronic switch with very low dynamic "on" resistance. There is an operational transconductance amplifier which includes a non-inverting input adapted for connection to a reference potential and an inverting input interconnected with the amplifier output. Control means enables the amplifier output to provide a low-impedance virtual potential inverting input approximately the same as that of the reference potential and for disabling the amplifier output to provide a high impedance at the inverting input.

In a preferred embodiment the inverting input and the output of the amplifier may be connected directly together, or they may be connected through a resistor or other impedance, or through an active element. The operational transconductance amplifier may include a current mirror circuit and an emitter driven input stage for regeneratively driving the current mirror circuit. The operational transconductance amplifier may also include a negative feedback loop for inverting the output of the current mirror and feeding it back to the emitter driven stage.

DISCLOSURE OF PREFERRED EMBODIMENT

Other objects, features and advantages will occur to those skilled in the art from the following description of a preferred embodiment and the accompanying drawings, in which.

The electronic switch with very low dynamic "on" resistance of this invention may be accomplished using an operational transconductance amplifier which has a non-inverting input adapted for connection to a reference potential and an inverting input which is interconnected with the amplifier output. The inverting input is typically connected directly, such as through a short or shunt, with the amplifier output, but a low-impedance element may be interposed. There are control means for enabling the amplifier output to provide a low-impedance virtual potential at the inverting input approximately the same as that of the reference potential and for disabling the amplifier output to provide a high impedance at the inverting input. The operational transconductance amplifier typically includes a current mirror circuit and an emitter driven input stage for regeneratively driving the current mirror circuit. There is a negative feedback loop which inverts the output of the current mirror and feeds it back to the emitter driven stage.

Figure 1:
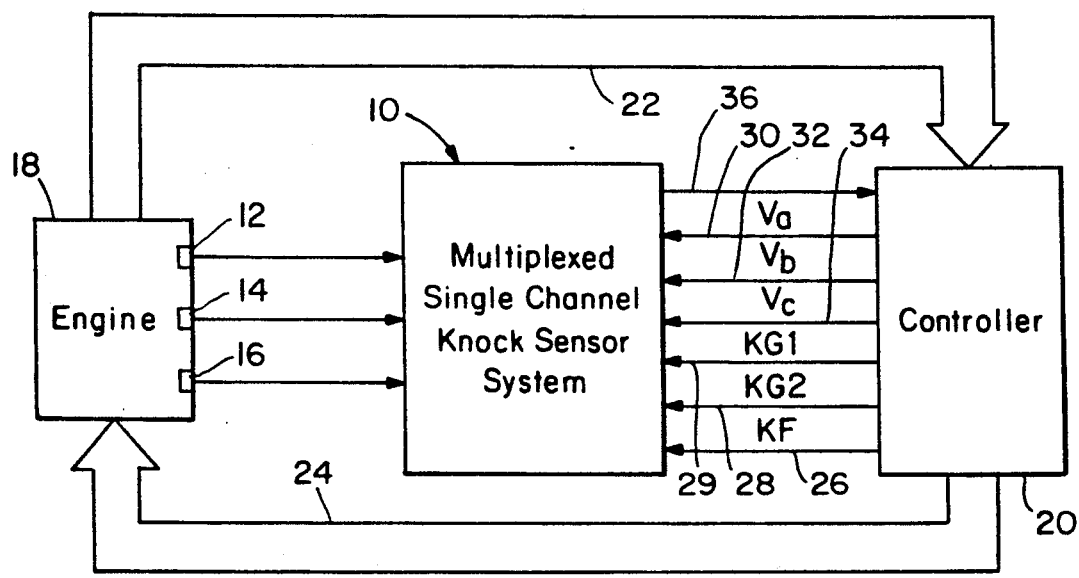
FIG. 1 is a simplified block diagram of a multiplexed single channel knock sensor signal conditioner system employing the electronic switch according to this invention installed with a controller for an internal combustion engine.

There is shown in FIG. 1 a multiplexed single channel knock sensor signal conditioner system 10, which senses the vibrations indicative of knock through a plurality of audio detectors such as microphones 12, 14 and 16 associated with engine 18. The details of engine 18 and its electronic controller 20 do not form a part of this invention and are well known in the automotive art. Controller 20 receives a number of signals over bus 22 from engine 18 and provides a number of control inputs which relate to the fuel mixture, timing, exhaust gas recirculation, and other parameters, over bus 24. Controller 20 also provides to system 10 signal KF on line 26 which defines the knock window, that is, the period of time during which a knock is to be expected, selection signals KG1, KG2 on lines 28 and 29 which selectively connect microphones 12, 14 or 16 to system 10; and three voltages $V_a$, $V_b$ and $V_c$ on lines 30, 32 and 34 which control the gain applied by system 10 to the signals from microphones 12, 14 and 16. The output from system 10 representing the magnitude of the knock signal from the currently selected microphone is delivered on line 36 to controller 20.

Figure 2:
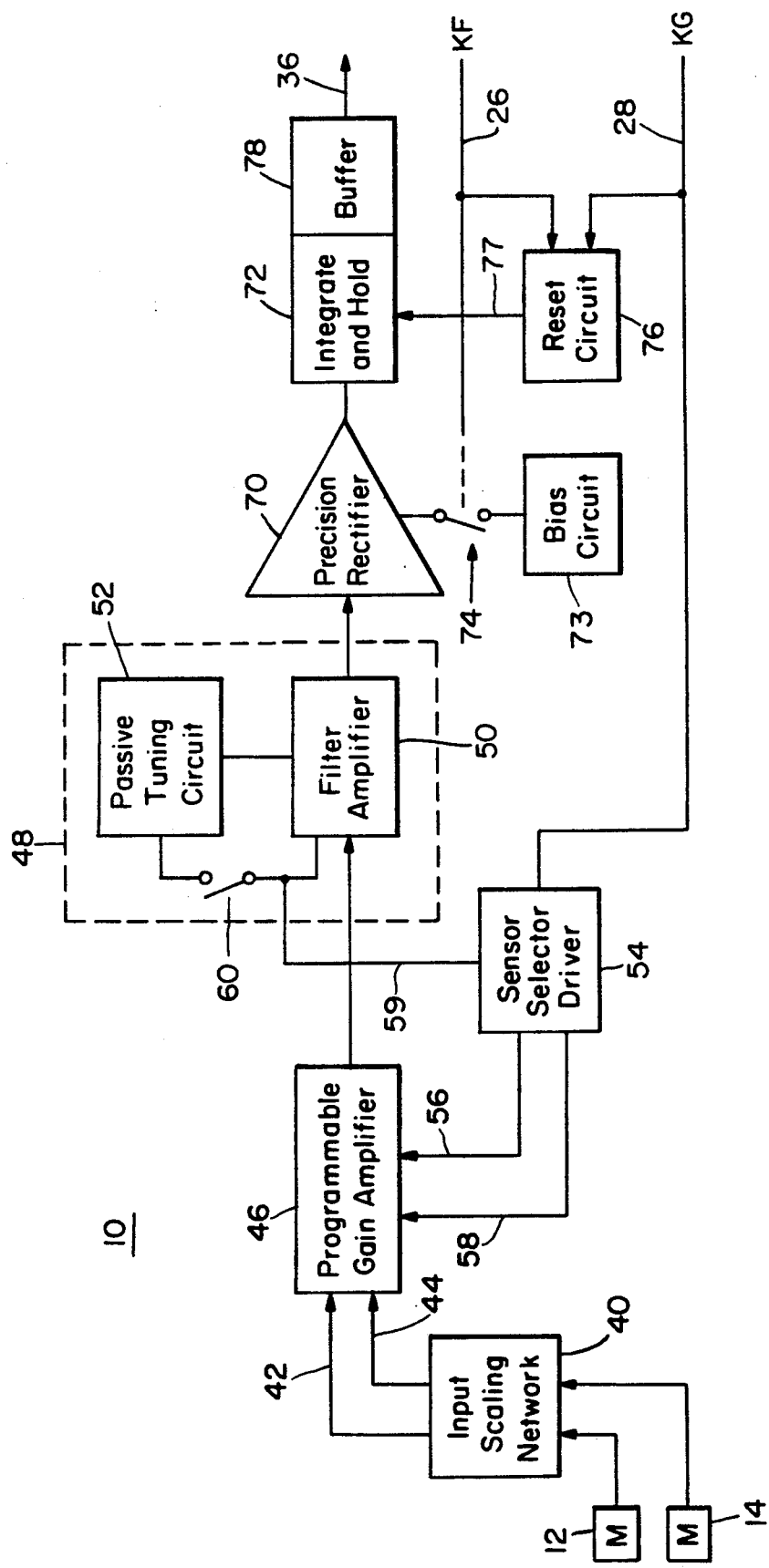
FIG. 2 is a more detailed block diagram of the multiplexed single channel knock sensor signal conditioner system of FIG. 1.

Multiplexed single channel knock sensor signal conditioner system 10 is shown in FIG. 2 in one implementation where it services but two sensors, microphones 12 and 14, whose outputs are first delivered to input scaling network 40, after which each of the outputs from sensors 12 and 14 are fed on lines 42 and 44, respectively, to programmable gain amplifier 46. The amplified version of the input signal appearing on line 42 or 44 is delivered to multiple feedback bandpass filter 48 which includes filter amplifier 50 and passive tuning circuit 52. Sensor selection driver 54 responds to the condition of the KG signal on line 28 which enables line 56 to select the output of microphone 12 on line 42 or enables line 58 to select the output of microphone 14 on line 44. Sensor selection driver 54 also operates via line 59 switch 60 in multiple feedback bandpass filter 48 to select the bandpass center frequency associated with the selected microphone.

Commonly, both microphones would be subject to the same center frequency but not always. In cases where there is an asymmetrical signal sensing environment, such as an odd number of cylinders or other differences in the engine design, separate tuning may be required for each of the sensors. The output from filter 48 which accentuates the frequencies in the range associated with the knocking phenomenon and suppresses the others is delivered to precision rectifier 70 which provides a unipolar rectified signal representative of the magnitude of the knock to integrate and hold circuit 72. The output of bias circuit 73 which enables the operation of rectifier 70 is applied to rectifier 70 through switch 74 only during the period of the knock window as determined by the KF signal supplied on line 26. After the end of the knock window, and an interval to read the output, the sensor select signal KG on line 28 operates reset circuit 76 to reset integrate and hold circuit 72. Upon the occurrence of the next knock window signal KF on line 26, reset circuit 76 is restored so that integrate and hold circuit 72 can once again integrate the signal from precision rectifier 70. The output of integrate and hold circuit 72 is delivered to buffer circuit 78 which delivers the output on line 36 to controller 20.

Figure 3:
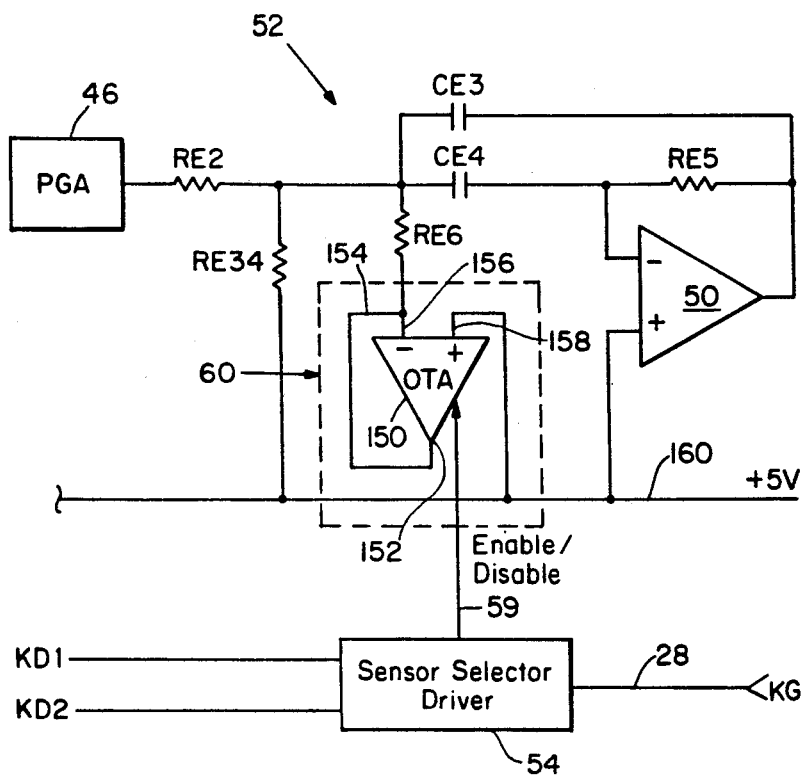
FIG. 3 is a more detailed block diagram of the multiple feedback bandpass filter of FIG. 2 showing the electronic switch with very low dynamic "on" resistance according to this invention.

Electronic switch 60, FIG. 3, employs an operational transconductance amplifier 150 whose output 152 is connected directly through shunt 154 to its inverting input 156. Its non-inverting input 158 is connected to +5 volt reference potential on line 160. Operational transconductance amplifier 150 is enabled and disabled by the signal on line 59 from sensor selection driver 54.

When amplifier 150 is operating, it provides a low-impedance virtual potential at the inverting input 156 which is approximately the same as the reference (+5 v) potential, and when the amplifier is disabled its output provides a high impedance at inverting input 156. The low-impedance condition is typically less than one ohm.

Figure 4:
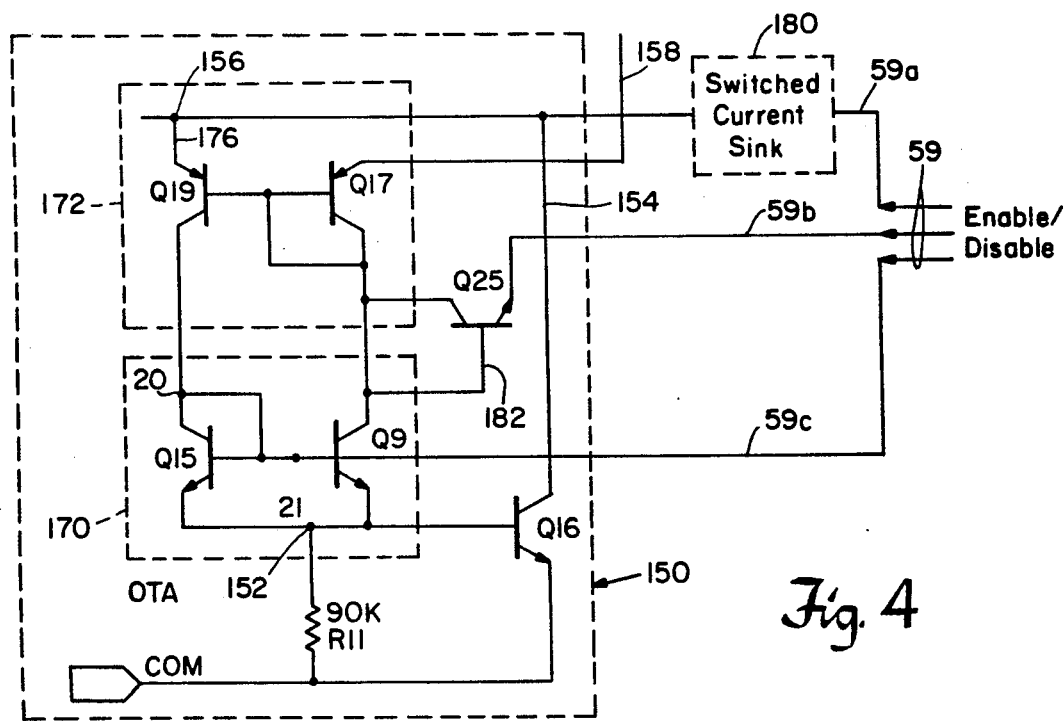
FIG. 4 is a more detailed circuit diagram of the electronic switch of FIG. 3.

Operational transconductance amplifier 150 may include a current mirror circuit 170, FIG. 4, which includes emitter coupled transistors Q15 and Q9 regeneratively fed by emitter driven input stage 172 which includes transistors Q19 and Q17. Resistor R11 is a biasing resistor which ensures at least a minimum current in the input stage. Transistor Q16 responds to the output from current mirror 170 and feeds it back on line 154 to the input of emitter driven input stage 172. Transistor Q16 functions as an inverting amplifier so that line 154 provides a negative feedback. When transconductance amplifier 150, FIG. 4, is operating, it is in its nature to have a very low input impedance at its inverting input 156. When it is not operating it is also in its nature to have a very high impedance at its inverting input 156.

The enable/disable line 59 actually includes three paths. The signal on line 59a supplies the operating current for Q16. A switched current sink 180 may be provided to control that current so that the circuit operates as a class A amplifier. The signal on line 59b operates diode 182 which provides a starting current to initiate operation of the amplifier. The signal on line 59c holds down the voltage on the bases of Q15 and Q9 when the circuit is disabled to prevent any current from flowing into the base of Q16 thereby keeping the amplifier off.

Although specific features of the invention are shown in some drawings and not others, this is for convenience only as each feature may be combined with any or all of the other features in accordance with the invention.

Other embodiments will occur to those skilled in the art and are within the following claims.

What is claimed is:

1. An electronic switch with very low dynamic "on" resistance comprising:
    an operational transconductance amplifier including a non-inverting input adapted for connection to a reference potential, and an inverting input interconnected with an output of the amplifier;
    in which said operational transconductance amplifier includes an emitter coupled current mirror circuit and an emitter driven input stage for regeneratively driving said current mirror circuit, wherein said input stage includes a pair of transistors, the emitters of the transistors forming said inverting and non-inverting inputs of the amplifier; and
    control means for enabling said amplifier output to provide a low impedance virtual potential at the inverting input approximately the same as that of the reference potential and for disabling said amplifier output to provide a high impedance at the inverting input.

2. The electronic switch of claim 1 in which said inverting input and the output of the amplifier are connected directly together.

3. The electronic switch of claim 1 in which said operational transconductance amplifier includes a negative feedback loop for inverting the output of said emitter coupled current mirror and feeding it back to said emitter driven stage.

* * * * *